United States Patent [19]
Jordan

[11] 3,983,461
[45] Sept. 28, 1976

[54] IGNITION PULSE GENERATOR

[75] Inventor: Richard James Jordan, Roseville, Mich.

[73] Assignee: General Marine, Inc., Bloomfield Hills, Mich.

[22] Filed: Feb. 25, 1975

[21] Appl. No.: 552,892

Related U.S. Application Data

[63] Continuation-in-part of Ser. No. 463,001, Dec. 21, 1973, Pat. No. 3,900,786, which is a continuation of Ser. No. 284,309, Aug. 28, 1972, abandoned.

[52] U.S. Cl........................... 317/151; 123/148 CB; 315/209 CD; 317/96
[51] Int. Cl.²........................................... F02P 9/00
[58] Field of Search.................. 317/96, 151, 148.5; 123/148 E, 148 OC; 315/209 CD

[56] References Cited
UNITED STATES PATENTS

| | | | |
|---|---|---|---|
| 2,799,809 | 7/1957 | Lautenberger............... | 315/209 CD |
| 3,383,555 | 5/1968 | Minks........................... | 315/209 CD |
| 3,545,419 | 12/1970 | Nolting......................... | 123/148 OC |
| 3,718,125 | 2/1973 | Posey........................... | 123/148 OC |

*Primary Examiner*—Harry Moose
*Attorney, Agent, or Firm*—Reising, Ethington, Barnard

[57] ABSTRACT

An ignition circuit of the capacitor discharge type is disclosed for internal combustion engines. The circuit comprises a transistor inverter which supplies a voltage doubler to charge a storage capacitor. The storage capacitor is connected to an ignition coil through a thyristor. Control means for the thyristor includes engine breaker points or equivalent for alternately preventing and enabling turn-on of the thyristor. A voltage divider provides gate triggering current to the thyristor on each cycle of the voltage supply. This produces either single or multiple ignition pulses for each breaker point cycle, depending upon the engine speed. The voltage divider includes a leakage resistor to limit the initial pulse and to allow current flow through the breaker points and also includes an isolation resistor to render the triggering point of the thyristor immune to changes in the breaker point circuit.

3 Claims, 1 Drawing Figure

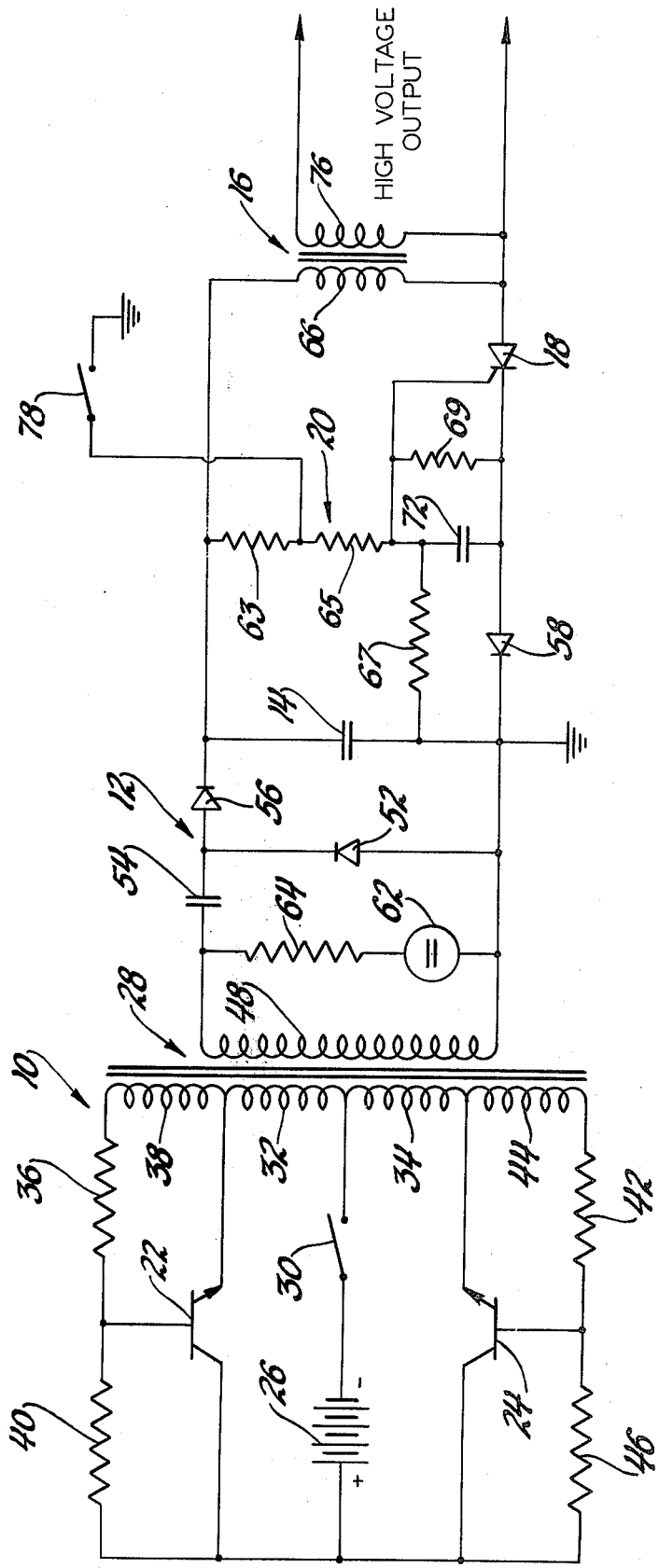

IGNITION PULSE GENERATOR

This is a continuation-in-part of patent application Ser. No. 463,001 filed Dec. 21, 1973 now U.S. Pat. No. 3,900,786, which is a continuation of application Ser. No. 284,309 filed Aug. 28, 1972 and now abandoned. The entire disclosures of application Ser. No. 463,001 filed Dec. 21, 1973 and application Ser. No. 284,309 filed Aug. 28, 1972 are incorporated herein by reference.

This invention relates to capacitor discharge circuits and more particularly to such circuits adapted to develop an output of high voltage pulses.

A well known application of high voltage pulsing circuits is that of supplying ignition voltage for internal combustion engines. Many forms of so called capacitor discharge ignition systems have been proposed in the prior art and a common difficulty has been encountered in the development of a sufficiently high voltage in charging the ignition or storage capacitor. A further problem in such systems is that of providing a regulated or predetermined quantity of energy in each pulse under widely varying conditions of operation. Further, difficulties have been encountered in obtaining circuit operation at high pulse repetition rates without the use of elaborate and complex circuitry. Previous attempts to utilize silicon controlled rectifiers for discharging the capacitor through the ignition coil have involved unduly complicated circuits for switching of the controlled rectifier.

In accordance with the present invention, a high voltage pulse generating circuit is provided which utilizes a capacitor discharge through a high voltage coil with predetermined voltage and energy per pulse at a desired pulse repetition rate. Such a device is realized utilizing a minimum number of circuit components. This is accomplished by the combination of an alternating voltage source, preferably in the form of a transistor inverter which is operative through a voltage doubler to charge a storage capacitor to a predetermined high voltage. A discharge circuit for the capacitor includes a thyristor, preferably in the form of a controlled rectifier, in series with a voltage transforming coil or output transformer with a load device such as voltage gap electrodes connected thereacross. The device includes control means connected with the gate of the thyristor for turning it on at controlled intervals whereby the capacitor is discharged through the voltage transforming means. Preferably the control means causes discharge during each cycle of the oscillator, and the half-cycle of the oscillator following initiation of the discharge is effective to quench the thyristor, thereby preventing loss of controlled switching.

A more complete understanding of this invention may be obtained from the detailed description that follows, taken with the accompanying drawings in which:

the single FIGURE is a schematic diagram of the inventive pulse generating circuit.

Referring now to the drawing, there is shown an illustrative embodiment of the invention in a pulse generating circuit adapted to develop a train of high voltage pulses from a low voltage battery energized power supply.

As shown in the drawing, the invention comprises a transistor oscillator or inverter 10 which supplies alternating voltage to a charging circuit 12, which in turn delivers charging current to a storage capacitor 14. The storage capacitor is connected with a voltage transforming means 16 through a thyristor 18. The thyristor is connected with control means 20 which turns on the thyristor at controlled intervals to discharge the capacitor 14 and thereby develop high voltage impulses across the output of the voltage transforming means 16.

Considering the circuit in greater detail, the inverter 10 suitably takes the form of a conventional pushpull transistor oscillator. As such, it comprises a pair of NPN power transistors 22 and 24, a direct voltage source such as a battery 26 and an output transformer 28. The transistor 22 has its output circuit from collector to emitter connected across the battery 26 through an on-off switch 30 and a primary winding 32 of the transformer 28. Similarly, the transistor 24 has its output extending from collector to emitter connected across the battery 26 through the switch 30 and a primary winding 34, which has one terminal in common with one terminal of the primary winding 32 and constituting a center tap on the combined windings 32 and 34. The transistor 22 has an input circuit from base to emitter, including a resistor 36 and a feedback winding 38. A forward bias for the transistor 22 is provided by a voltage divider comprising a resistor 40 and the resistor 36. Similarly, the transistor 24 has an input circuit extending from base to emitter through a resistor 42 and a feedback winding 44. A forward bias is provided for this transistor by a voltage divider comprising a resistor 46 and the resistor 42. The output transformer 28 is also provided with a secondary winding 48 which, in operation of the oscillator, produces an output alternating voltage.

The operation of a transistor oscillator of the type described is well known and need not be described in detail. Suffice it to say that upon closure of the switch 30, both of the transistors 22 and 24 are forwardly biased and both become conductive. However, because of inherent circuit unbalance one becomes more conductive than the other through its associated primary winding and consequently positive feedback to that transistor through the associated feedback winding drives that transistor quickly into saturation and the induced voltage in feedback winding of the other transistor drives it to cut-off. When current saturation is reached in the first transistor, the feedback voltage is reduced to zero and the decreasing current in the primary winding of the conductive transistor results in collapse of the magnetic flux and a reversal of polarity of the induced voltages in the feedback windings. Accordingly, the first transistor is cutoff and the other transistor becomes conductive and is driven to current saturation. This cycle of operation is repetitive at a frequency determined by the parameters of the oscillator circuit and consequently an alternating voltage is developed across the output terminals of the secondary winding 48. As is well known, the output voltage has a somewhat rectangular waveform due to the rapid switching characteristics of the transistors 22 and 24.

The charging circuit 12 is adapted to charge the storage capacitor 14 toward a voltage value equal to twice the peak value of the alternating voltage of the secondary winding 48. For this purpose the charging circuit comprises a first rectifying diode 52, connected in series with a coupling capacitor 54 across the secondary winding 48. The circuit also includes a second rectifying diode 56 connected between the junction of capacitor 54 and diode 52 and one terminal of the storage capacitor 14. The coupling capacitor 54 is preferably small enough so that it does not reduce the free-running frequency of the inverter 10. The storage capacitor 14 is several times larger than the capacitor 54, preferably by a factor of at least three. In the operation of the charging circuit 12 the coupling capacitor 54 will be charged through the rectifying diode 52 during one half-cycle of the alternating voltage toward the peak value of voltage across secondary winding 48. The rectifying diode 52 prevents discharge of the holding capacitor 54 through its charging circuit following the first half-cycle. During the succeeding half cycle, with the polarity across the secondary winding reversed, the voltage thereof is additively combined with the voltage across the holding capacitor 54 in series with the rectifying diode 56 and the storage capacitor 14. Accordingly, the storage capacitor 14 is charged toward a voltage equal to twice the peak value of voltage across the secondary winding. For the purpose of providing a visual indication of the operative condition of the inverter 10, a neon lamp 62 is connected across the secondary winding 48 with a series resistor 64 and hence is illuminated when the inverter is running.

The discharging circuit for the storage capacitor 14 extends from one terminal thereof through the primary winding 66 of the voltage transforming device 16 and thence through the output, i.e., anode to cathode of the thyristor 18 which preferably takes the form of a silicon controlled rectifier. As is well known, a thyristor is a rectifier of the solid state semi-conductor type which becomes forwardly conductive from anode to cathode when the voltage impressed thereacross exceeds a threshold value and when the current from the gate to cathode exceeds a predetermined value. The anode to cathode remain conductive, even after the gate to cathode current is reduced to zero, so long as voltage applied thereacross exceeds the threshold value. Thus the thyristor or silicon controlled rectifier 18 is turned on only by the requisite gate current and can be turned off only by the requisite reduction of cathode to anode voltage to quench the output.

The discharging circuit is completed from the cathode of the thyristor 18 through a conductive path to the other terminal of the capacitor 14. This conductive path, as shown, includes a diode 58 which aids the turn-off of the thyristor.

The control means 20 for controlling the turn-on of the thyristor 18 is adapted to synchronize the switching point thereof with the actuation of breaker points or equivalent switching means in a conventional ignition system for automotive vehicles. For this purpose the control circuit comprises a voltage divider including a leakage current resistor 63, an isolation resistor 65, and an output resistor 67 in series across the storage capacitor 14. The breaker points 78 are connected between the junction of resistors 63 and 65 and ground. The gate of the thyristor 18 is connected to the junction of resistors 65 and 67. A filter capacitor 72 is connected between the gate and cathode of the thyristor to diminish the possibility of switching of the thyristor by noise or spurious currents. A resistor 69 is connected between the gate and cathode of the thyristor and affects the turn-on point in relation to the voltage across the capacitor 14. The resistor 69 is suitable a thermistor, or thermistor network, to provide temperature compensation for the thyristor. The voltage transforming means 16 preferably takes the form of a high voltage spark coil with the primary and secondary windings having a common connection which constitutes an intermediate tap on a single coil and serves as a common return or ground conductor. Thus the transforming means has the configuration of an autotransformer as is commonly used for ignition coils.

Operation of the inventive high-voltage pulse generating circuit is as follows: When the switch 30 is closed the inverter 10 is operative and produces an alternating output voltage across the secondary winding 48. On each full cycle of the oscillator 10 the storage capacitor 14 is charged toward a value equal to twice the peak value of the alternating voltage across the secondary winding. During the first half-cycle the capacitor 54 is charged and during the second half-cycle the voltage across the capacitor 54 and the voltage across the secondary winding 48 are additively combined across the storage capacitor 14, whereby it is charged toward a value equal to twice the peak voltage across the transformer secondary. As the capacitor 14 is charged, the voltage thereacross is also applied across the voltage divider including the series resistors 63, 65 and 67. The breaker points 78 are opened and closed periodically at a rate corresponding with engine speed. When the breaker points are closed the junction of resistors 63 and 65 is connected to ground and no current will flow from the capacitor 14 to the gate of the thyristor. Therefore the thyristor is turned off when the breaker points are closed. When the breaker points open the capacitor 14 is already charged. The frequency of the oscillator 10 is high enough so that there is at least one cycle during the closed interval or dwell time of the breaker points with the engine running at its maximum speed. The dwell time is thus long enough that the voltage at the junction of resistors 65 and 69 will cause a triggering current to flow through the gate of the thyristor and it is turned on. A discharging circuit is thus completed through the primary winding of the coil 16 and the resulting primary current impulse produces a high voltage output pulse across the secondary winding 76. The capacitor 14 is quickly discharged through the thyristor 18 and the thyristor is turned off in readiness for the next cycle of operation. The turn-off or quenching of the thyristor 18 is believed to be accomplished in either of two ways depending upon the operating conditions. When the high voltage across the secondary winding 76 is allowed to discharge, the energy in capacitor is exhausted, thereby terminating current flow through the thyristor. When the high voltage across the secondary winding is not allowed to discharge, the reflected counter electromotive force in the primary winding 66 terminates the current flow through the thyristor. Thus the thyristor 18 is turned off at the end of the first cycle and the succeeding cycle commences. As previously described, the first half-cycle thereof is operative to charge the capacitor 54 and the second half-cycle is operative to apply the transformer secondary voltage and the voltage of capacitor 54 to the storage capacitor 14. When a predetermined voltage is reached, the control circuit 20 turns on the thyristor to discharge the capacitor 14 through the primary winding 66 to produce a high voltage pulse in the output winding 76, as previously described.

The production of high voltage pulses in the output winding 76 continues in a free-running mode so long as the breaker points remain open. Thus, at low engine speeds a train of multiple ignition pulses is produced for each opening of the breaker points. At high engine speed only a single ignition pulse may be produced for each opening of the breaker points. It will be appreciated that the frequency of the oscillator 10 can be set so that it is effective to limit or govern the engine speed at some predetermined maximum value.

The control circuit 20 will now be described in greater detail in relation to the operation described above. When the breaker points are closed, the storage capacitor 14 tends to charge toward a value equal to twice the amplitude of the alternating voltage of the oscillator 10. When the breaker points open the capacitor 14 is instantly discharged and produces an initial or controlled pulse. So long as the breaker points remain open, pulses will be produced in a free-running mode. Each free-running pulse occurs when the voltage across the capacitor 14 reaches a value high enough to trigger the thyristor 18. The value of the capacitor voltage is thus limitied during the free-running mode so that the free-running pulses are uniform in voltage and energy content. However, without special provision, the initial or controlled pulse is of higher voltage and greater energy content due to the charging of the capacitor, with the breaker points closed, to a value greater than that required for triggering the thyristor. According to this invention, the capacitor voltage is limited to a desired value by the special voltage divider arrangement of resistors 63, 65 and 67 and the connection of the breaker points 78 thereto. When the breaker points are closed, a current bleed or leakage path is provided from the capacitor 14 through the current leakage resistor 63 and the breaker points to ground. The value of resistor 63 is selected so that the current flow therethrough will limit the charging of the capacitor 14 to a voltage value substantially equal to that required for firing the thyristor when the breaker points are open. This arrangement causes the initial discharge pulse to occur at substantially the same voltage and energy content as the subsequent free-running pulses. This voltage limiting arrangement for the storage capacitor also reduces the peak inverse voltage to which the thyristor is subjected. In the voltage divider of the control circuit, the isolation resistor 65 is connected between the breaker points 78 and the gate of the thyristor; it functions to isolate the gate from the breaker points and is of relatively high value. This feature of the invention renders the circuit operation substantially immune to resistance changes which are known to occur in the breaker point circuit with aging and wear of the breaker points. The resistance of the breaker point circuit may vary from substantially zero to several thousand ohms while the gate to cathode circuit of a thyristor is typically a few tens of ohms. With resistor 65 having a resistance value many times greater, such as 100 times greater, than the resistance value of the gate to cathode of the thyristor, variations in the breaker point circuit resistance will not affect the firing point of the thyristor. Accordingly, the ignition circuit of this invention is capable of producing proper ignition even after the breaker point operation has substantially deteriorated. In addition, this voltage divider connection of the breaker points provides for a significant current flow through the breaker points so long as they are closed. Current flow through ignition breaker points is known to have a beneficial effect in prolonging the life of the contacts and maintaining them in good operating condition. The voltage divider of the control circuit 20 provides the triggering input to the thyristor 18 by connection of the gate to cathode of the thyristor across output resistor 67. The resistor 67 is of small resistance value relative to that of resistors 63 and 65. For example, a typical voltage divider may have a resistor 63 of 20,000 ohms, a resistor 65 of 10,000 ohms and a resistor 67 of 700 ohms.

It is to be noted that the inventive high voltage pulse generating circuit is operative to produce a train of high voltage pulses, all of which represent or contain a predetermined quantity of energy. This type of operation is achieved because the storage capacitor 14 is discharged only after it has been charged to a predetermined value of voltage. Such operation is achieved even though the output of the oscillator 10 may vary due to fluctuations in voltage of the battery 26. Further, it is to be noted that the output pulse energy remains substantially the same regardless of the impedance of the load device across the secondary winding. The circuitry is capable of operating with a short circuit across the secondary winding 76 without imposing any more drain on the battery 26 than when it is operated with normal load or under open circuit conditions. This operation obtains because only a fixed amount of energy is transferred to the load or output circuit during each discharge period of the capacitor 14. In effect, the load or output circuit is disconnected from the capacitor 14 during the charging interval and the oscillator and battery are disconnected from the capacitor 14 and hence the output circuit during the discharging interval.

Although the description of this invention has been given with reference to a particular embodiment, it is not to be construed in a limiting sense. Many variations and modifications will now occur to those skilled in the art. For a definition of the invention reference is made to the appended claims.

The embodiments of the present invention in which an exclusive property or privilege is claimed are defined as follows:

1. An ignition circuit for internal combustion engines comprising an alternating voltage source, a charging circuit including a coupling capacitor, a rectifier and a storage capacitor connected in series across said source, a thyristor including an anode, a cathode and a gate, a discharging circuit including the anode and cathode of the thyristor, and an ignition coil connected in series across said storage capacitor, control means including switching means for preventing turn-on of the thyristor when closed and enabling turn-on of the thyristor when opened, said control means also including a current leakage resistor having one terminal connected to one terminal of said storage capacitor, an output resistor having one terminal connected to the other terminal of said storage capacitor, and an isolation resistor connected between the leakage resistor and the output resistor, the junction of the output resistor and the isolation resistor being connected to said gate, said switching means being connected between the other terminal of said storage capacitor and the junction of the leakage resistor and the isolation resistor, said switching means being adapted to be alternately closed for a time interval and opened for a time interval in timed relation with operation of the engine, the frequency of said source being high enough in relation to the closed interval of said switching means at maximum engine speed so that there is at least one charging cycle for each closed interval and a controlled discharge pulse is produced through said ignition coil when said switching means is opened, said frequency being high enough in relation to the opened interval at minimum engine speed so that at least one additional charging cycle occurs during each opened interval to produce a free-running discharge pulse through said ignition coil.

2. The invention as defined in claim 1 wherein said coupling capacitor is the sole charging path for said storage capacitor whereby the current drawn from said source during the discharge of said storage capacitor is limited by the impedance of said coupling capacitor.

3. The invention as defined in claim 2 including a semiconductor diode connected in series with, and in the same polarity as, the thyristor between the cathode of the thyristor and the storage capacitor.

* * * * *